United States Patent
Aoki et al.

(10) Patent No.: US 9,270,235 B2
(45) Date of Patent: Feb. 23, 2016

(54) AMPLIFIER AND AMPLIFYING METHOD

(71) Applicant: FUJITSU LIMITED, Kawasaki-shi, Kanagawa (JP)

(72) Inventors: Nobuhisa Aoki, Kawasaki (JP); Toru Maniwa, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 31 days.

(21) Appl. No.: 14/080,429

(22) Filed: Nov. 14, 2013

(65) Prior Publication Data

US 2014/0218105 A1 Aug. 7, 2014

(30) Foreign Application Priority Data

Feb. 1, 2013 (JP) .................. 2013-018914

(51) Int. Cl.
- *H03F 3/191* (2006.01)
- *H03F 1/56* (2006.01)
- *H03F 3/60* (2006.01)

(52) U.S. Cl.
CPC .................. *H03F 1/565* (2013.01); *H03F 3/60* (2013.01); *H03F 2200/387* (2013.01)

(58) Field of Classification Search
CPC ............................ H03F 3/191; H03F 2200/387
USPC .................................................. 330/302, 306
See application file for complete search history.

(56) References Cited

U.S. PATENT DOCUMENTS

| 4,580,290 A * | 4/1986 | Ushida .......................... 455/319 |
| 5,159,287 A | 10/1992 | Furutani et al. |
| 5,274,341 A * | 12/1993 | Sekine et al. ................. 330/269 |
| 7,764,125 B2 * | 7/2010 | Dawe ........................... 330/305 |

FOREIGN PATENT DOCUMENTS

| JP | 04-077009 A | 3/1992 |
| JP | 09-326648 A | 12/1997 |
| JP | 2007-329669 A | 12/2007 |
| JP | 2010-199874 A | 9/2010 |
| JP | 2011-035761 A | 2/2011 |

* cited by examiner

*Primary Examiner* — Steven J Mottola
(74) *Attorney, Agent, or Firm* — Arent Fox LLP

(57) ABSTRACT

An amplifier includes: an amplifying device configured to amplify an input signal; and a matching circuit coupled to the amplifying device, and including an impedance transformer and a parallel resonance circuit coupled to a wiring which spans from the impedance transformer to the amplifying device, wherein a circuit length of the impedance transformer is longer than one-fourth of wavelength of an electronic wave having a frequency which is substantially equal to a resonance frequency of the parallel resonance circuit.

9 Claims, 18 Drawing Sheets

| | $Z_{Oop} \cdot \dfrac{1}{tan(2 \cdot \pi \cdot \dfrac{l_{op}}{\lambda})}$ OR $Z_{Osh} \cdot tan(2 \cdot \pi \cdot \dfrac{l_{sh}}{\lambda})$ VALUE |
|---|---|
| ——— | 186.6 |
| - - - - | 86.6 |
| ——— | 50 |
| — · — | 28.9 |
| ······· | 13.4 | ated
AMPLIFIER AND AMPLIFYING METHOD

CROSS-REFERENCE TO RELATED APPLICATION

This application is based upon and claims the benefit of priority from the prior Japanese Patent Application No. 2013-018914 filed on Feb. 1, 2013, the entire contents of which are incorporated herein by reference.

FIELD

Embodiments are related to an amplifier and an amplifying method.

BACKGROUND

A power amplifier used for high frequency signal processing is used in various equipments such as a communication apparatus, and an impedance matching in the power amplifier is improved over broadband.

Japanese Patent Application Laid-Open No. 2011-35761 discloses related technology.

SUMMARY

According to an aspect of the embodiments, an amplifier includes: an amplifying device configured to amplify an input signal; and a matching circuit coupled to the amplifying device, and including an impedance transformer and a parallel resonance circuit coupled to a wiring which spans from the impedance transformer to the amplifying device, wherein a circuit length of the impedance transformer is longer than one-fourth of wavelength of an electronic wave having a frequency which is substantially equal to a resonance frequency of the parallel resonance circuit.

The object and advantages of the disclosure will be realized and attained by the elements and combinations particularly pointed out in the claims.

It is to be understood that both the foregoing general description and the following detailed description are exemplary and explanatory, and are not restrictive of the invention, as claimed.

DESCRIPTION OF EMBODIMENTS

Figure 1:
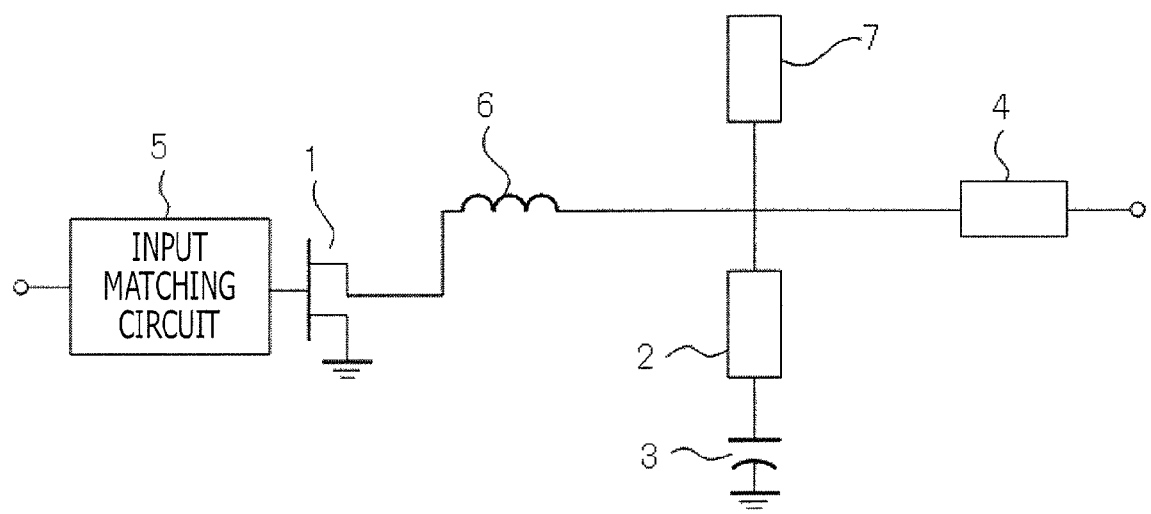
FIG. 1 illustrates an example of an amplifier.

FIG. 1 illustrates an example of an amplifier. The amplifier illustrated in FIG. 1 includes, for example, a transistor 1 which amplifies a high frequency signal, an impedance transformer 4 which is a transmission line having a line length of one-fourth wavelength of a use frequency, a series inductor 6, a stub 2, a capacitor 3 and an open stub 7. Signal is input to the transistor 1 through an input matching circuit 5. One end of the series inductor 6 is coupled to an output terminal of the transistor 1, and the stub 2 and the open stub 7 are coupled to the other end of the series inductor 6. The stub 2 is coupled to the capacitor 3 to short-circuit high frequency signals, and the stub 2, the open stub 7 and the capacitor 3 are operated as a resonance circuit. One end of the impedance transformer 4 is coupled to a connection point of one end of the open stub 7 and one end of the stub 2. The resonance circuit coupled to the impedance transformer 4 in parallel conjugate matches an impedance of the impedance transformer with another impedance of the resonance circuit side seen from the connection point of the impedance transformer 4 and the resonance circuit.

When the conjugate matching is performed to be adjusted to the impedance characteristic of the impedance transformer, the parallel resonance circuit is designed such that the inductive reactance is employed in a frequency region having a relatively low frequency and the capacitive reactance is employed in another frequency region having a relatively high frequency among the use frequencies in accordance with the impedance characteristic of the impedance transformer. In such a design, since an operation band of the resonance circuit becomes narrower, the variation of reactance due to the deviation of the device included in the resonance circuit becomes large. When an effect of the device deviation is large, it may be difficult to manufacture a stable amplifier.

Figure 2A:
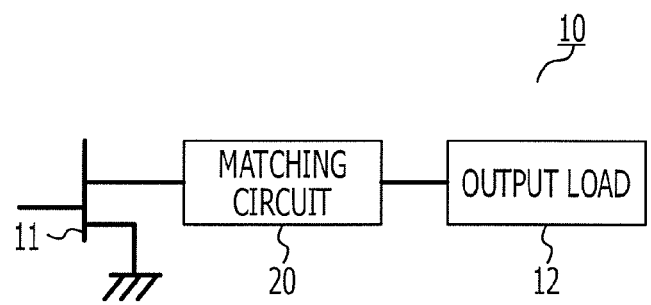
FIG. 2A illustrates an example of an amplifier.
Figure 2B:
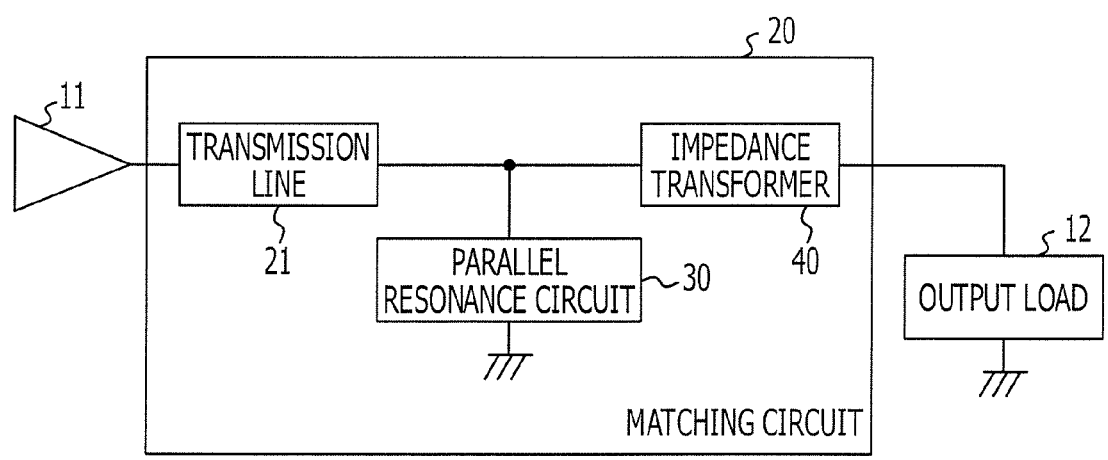
FIG. 2B illustrates an example of a matching circuit.

FIG. 2A illustrates an example of an amplifier. The amplifier 10 illustrated in FIG. 2 includes, for example, an amplification device 11 and a matching circuit 20, and is coupled to an output load. The amplification device 11 may be, for example, a transistor. In the amplifier 10, the matching circuit 20 is arranged to be coupled between the amplification device 11 and the output load 12. FIG. 2B illustrates an example of a matching circuit. The matching circuit 20 includes, for example, a transmission line 21, a parallel resonance circuit 30 and an impedance transformer 40.

Figure 3A:
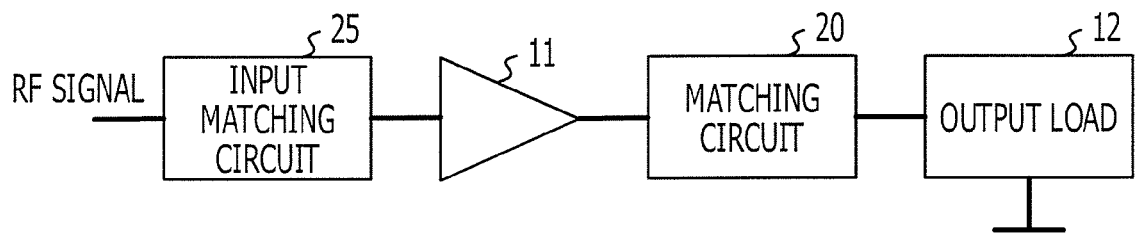
FIG. 3A illustrates an example of a matching circuit.

FIG. 3A illustrates an example of a matching circuit. For example, a target matching value at the time when the frequency characteristic of the matching circuit 20 is adjusted is obtained as follows. As illustrated in FIG. 3A, the matching circuits, for example, the output matching circuit 20 and the input matching circuit 25, may be coupled to the input and output of the amplification device 11, respectively. In this case, an output current output from the amplification device 11 is represented by a cosine wave and the harmonics according to an input bias condition. When the input bias condition corresponds to the bias condition of Class B amplifier, the output current is represented by the following equation (1).

$$i(\theta) = \frac{1}{\pi} + \frac{1}{2}\cos\theta + \frac{2}{3\pi}\cos 2\theta - \frac{2}{15\pi}\cos 4\theta + \frac{2}{35\pi}\cos 6\theta - \ldots \quad (1)$$

A waveform an output voltage of the matching circuit 20 is represented by the equation (2).

$$v(\theta) = 1 - \cos\theta - \alpha\sin\theta + \frac{1}{2}\alpha\sin 2\theta \quad (2)$$

For example, an equation may be used as described in an article by Steve C. Cripps et. al., entitled "On the Continuity of High Efficiency Modes in Linear RF Power Amplifiers", IEEE Microwave and Wireless Components Letters, Vol. 19, No. 10, pp. 665-667, October 2009. The coefficient "$\alpha$" is a value satisfying $-1 \leq \alpha \leq 1$ and a coefficient of the term of the harmonics and the fundamental wave. The waveform of the output current is sum of the cosine wave and harmonics of the cosine wave. A voltage component that can be represented by the sine wave and the harmonics of the sine wave among the equation (2) is orthogonal to a current component represented by the cosine wave and the harmonics of the cosine wave of the output current. Thus, there may be no influence on the power efficiency. Therefore, a load matching circuit which generates the voltage of the equation (2) may have substantially the same efficiency as another load matching circuit which generates a voltage of $1-\cos\theta$. In a case of Class B amplifier, the voltage may be $1-\cos\theta$. Therefore, both impedances of the second order harmonic and the fundamental wave are matched in the matching circuit, the amplification device 11 may operate as a high-efficiency amplifier corresponding to Class B amplifier.

Figure 3B:
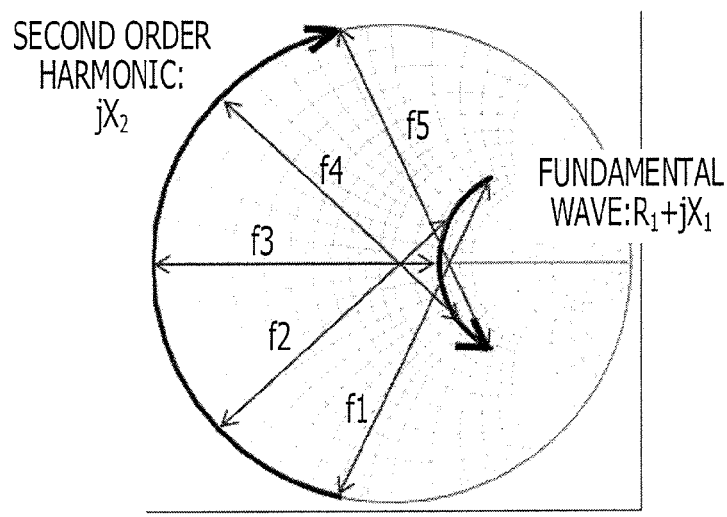
FIG. 3B illustrates an example of an impedance relationship between harmonics and a fundamental wave.

FIG. 3B illustrates an example of a relationship between impedances of the harmonics and a fundamental wave. For simplification, FIG. 3B illustrates the variation of impedances of the second order harmonic and a fundamental wave based on the frequency for a case where a parallel load capacitance of the amplification device 11 is negligible. In the impedance of the fundamental wave, the resistance component is not varied and the reactance component becomes gradually smaller as the value of the "$\alpha$" in the equation (2) becomes larger. Therefore, the impedance of the fundamental wave may move in a counter-clockwise direction on the equal resistance line in the Smith Chart illustrated in FIG. 3B, as the value of the "$\alpha$" increases. In the impedance of the second order harmonic, the resistance component is not present and the reactance component increases as the value of the "$\alpha$" in the equation (2) increases. Therefore, the impedance of the second order harmonic moves in a clockwise direction on the periphery in the Smith Chart illustrated in FIG. 3B. The impedance of the matching circuit is matched to either impedance of the second order harmonic or impedance of the fundamental wave according to the frequency in the matching circuit and thus, a band that is efficiently amplified may be widened. The impedances of the fundamental wave and the second order harmonic of the respective frequencies f1-f5 are represented in FIG. 3B. The frequency may become higher in the order of f1<f2<f3<f4<f5 in FIG. 3B.

Figure 4A:
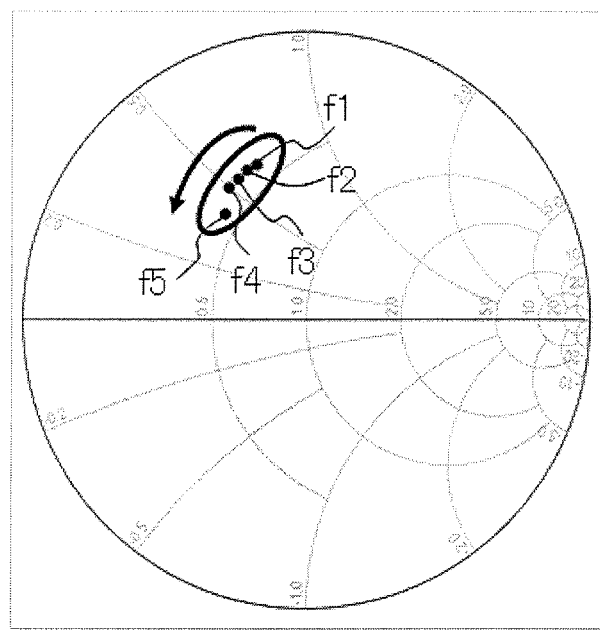
FIG. 4A illustrates an example of a fundamental impedance.
Figure 4B:
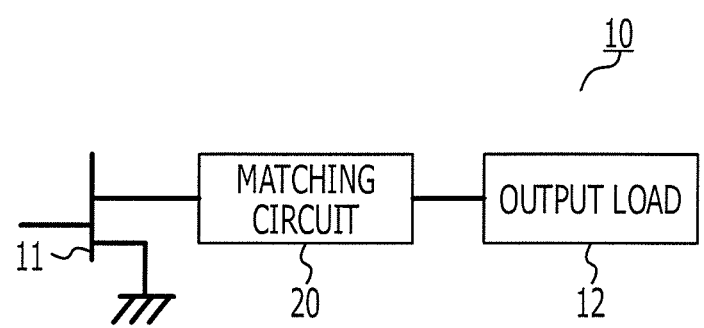
FIG. 4B illustrates an example of matching circuit.

FIG. 4A illustrates an example of an impedance of fundamental wave. FIG. 4B illustrates an example of a matching circuit. The impedance of the fundamental wave output from the amplification device 11 is illustrated in FIG. 4A. When the amplification device 11 and the matching circuit 20 are matched with each other in the amplifier 10 illustrated in FIG. 4B, the impedance illustrated in FIG. 4A may be an impedance obtained from the matching circuit 20 side seen from the connection point of the amplification device 11 and the matching circuit 20. The points surrounded by a circle illustrated with a bold line in FIG. 4A represent theoretical values obtained from the matching circuit 20 which is in matching with respect to signals having frequencies of f1, f2, f3, f4, f5. As the frequency becomes higher, the impedance of the matching circuit 20 varies as represented by the arrow. For example, when the impedance of the matching circuit is matched with the fundamental wave of an output from the amplification device 11, the target value of impedance of the matching circuit 20 may be points surrounded by a circle illustrated with a bold line in FIG. 4A. The second order harmonic is matched to the value indicated in FIG. 3.

The impedance transformer 40 adjusts the resistance component of the impedance of the output load 12 to the target impedance for matching. The impedance transformer 40 may be designed such that variation of the reactance component based on variation of the frequency of the input signal becomes small. The circuit length of the impedance transformer 40 is made longer than one-fourth of the wavelength of an electronic wave having a frequency substantially equal to the resonance frequency of the parallel resonance circuit 30. As a result, the variation of the reactance in the impedance transformer may become small. The impedance transformer 40 may be designed such that the variation of the reactance in the impedance transformer 40 becomes smaller than the variation of the reactance component based on the variation of the frequency in a device side rather than the transmission line 21. For example, the impedance transformer 40 may be designed such that the variation of the reactance seen at the impedance transformer 40 due to the variation of the frequency is small enough to be excluded from the targets for the conjugate matching. For example, the impedance transformer 40 may be designed such that the variation of the reactance in the impedance transformer 40 due to the variation of the frequency of signal is smaller than the variation of the reactance in the amplification device 11 based on the variation of the frequency of signal.

Figure 5:
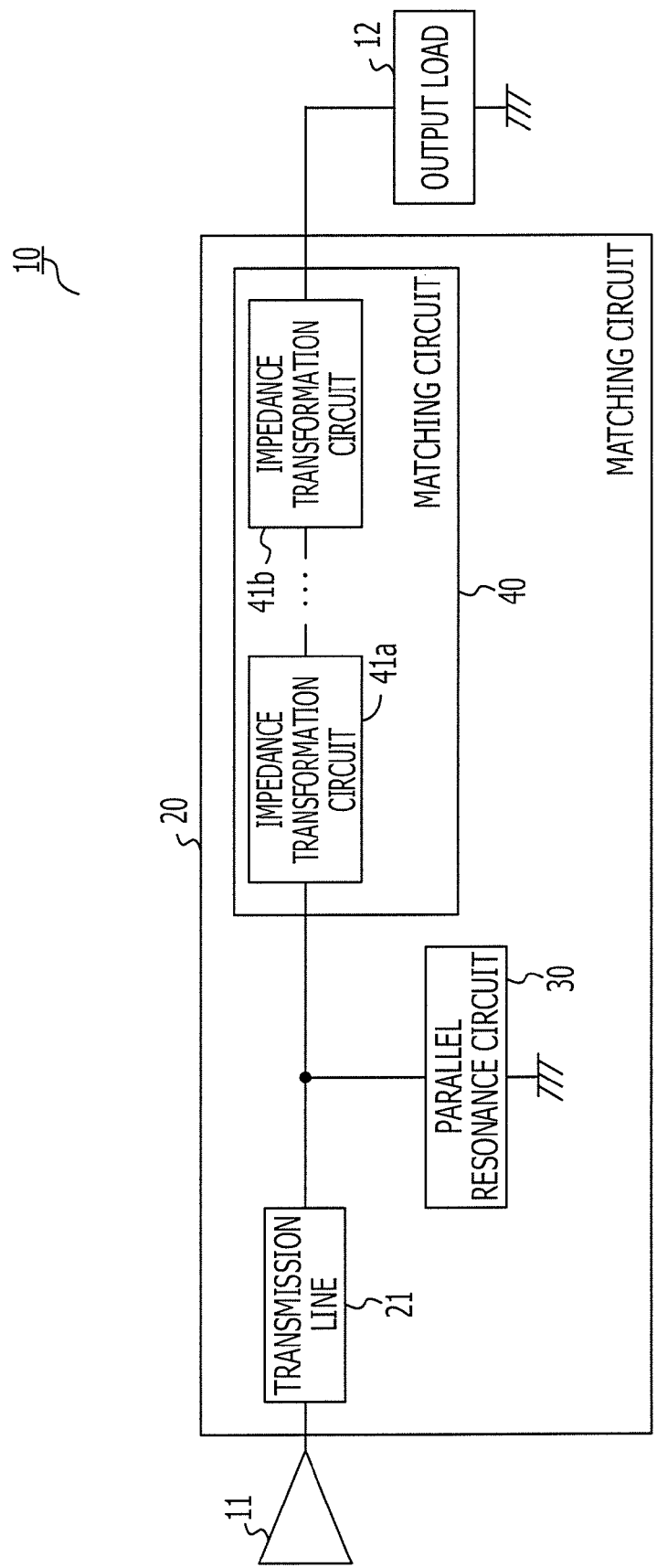
FIG. 5 illustrates an example of amplifier.

FIG. 5 illustrates an example of an amplifier. The amplifier illustrated in FIG. 5 includes, for example, the impedance transformer 40 including a plurality of impedance transformation circuits 41. The impedance transformer 40 illustrated in FIG. 5 includes, for example, the impedance transformation circuits 41a and 41b, but the number of impedance transformation circuits included in impedance transformation circuit 41 may be two or more. Electrical length or value of characteristic impedance of each impedance transformation circuit 41 may be set arbitrarily, and the circuit length of the impedance transformer 40 may be longer than one-fourth of wavelength of an electronic wave having the frequency substantially equal to the resonance frequency of the parallel resonance circuit 30. The wavelength of the electronic wave having the frequency substantially equal to the resonance frequency of the parallel resonance circuit 30 may be referred to as λ.

Figure 6A:
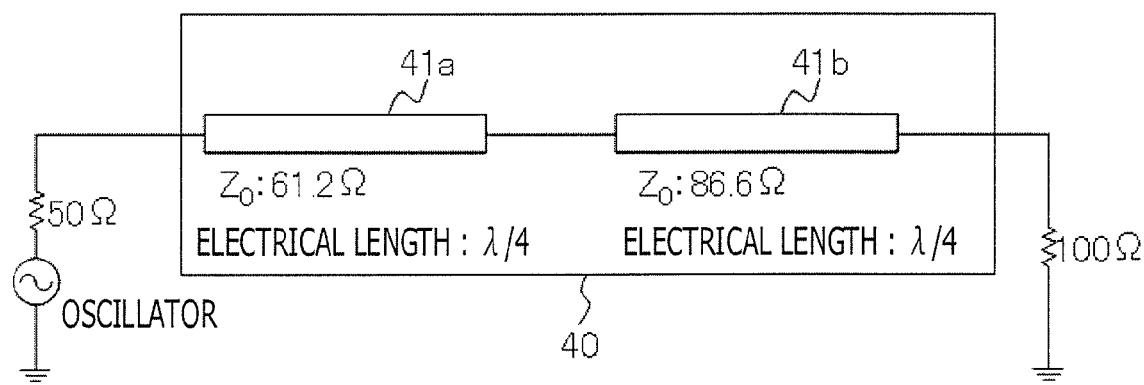
FIG. 6A illustrates an example of an impedance transformer.
Figure 6B:
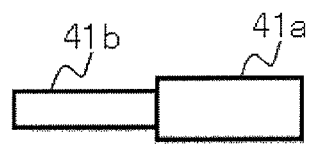
FIG. 6B illustrates an example of an impedance transformation circuit.

FIG. 6 illustrates an example of an impedance transformer. In FIG. 6, one end of the impedance transformer 40 and an oscillator are coupled with each other while sandwiching 50Ω resistor therebetween. The other end of the impedance transformer 40 is grounded while sandwiching 100Ω resistor between the impedance transformer 40 and ground. The impedance transformer 40 illustrated in FIG. 6A includes, for example, the impedance transformation circuit 41*a* and the impedance transformation circuit 41*b*. The characteristic impedance and the circuit length of the impedance transformation circuit 41*a* may be 61.2Ω and λ/4, respectively. The characteristic impedance and the circuit length of the impedance transformation circuit 41*b* may be 86.6Ω and λ/4, respectively. In FIG. 6, the characteristic impedance is represented by Z0. As illustrated in FIG. 6A, the plurality of impedance transformation circuits 41 may have substantially the same circuit length as well as different circuit lengths. In FIG. 6A, the circuit length of the impedance transformer 40 may be λ/2. Each impedance transformation circuit 41 may be formed by using, for example, a transmission line. The impedance transformer 40 may be formed by coupling a plurality of transmission lines having different line widths. FIG. 6B illustrates an example of an impedance transformation circuit. In FIG. 6B, the impedance transformer 40 illustrated in FIG. 6A is formed by using the transmission line. In FIG. 6B, the line length of the impedance transformation circuit 41*a* and that of the impedance transformation circuit 41*b* is substantially equal, but the line width of the impedance transformation circuit 41*a* may be wider than that of the impedance transformation circuit 41*b*. In FIGS. 6A and 6B, each impedance transformation circuit 41 having the transmission line length of λ/4 is illustrated, but the line length of the impedance transformation circuit 41 may be changed according to installation conditions. The characteristic impedance of the impedance transformation circuit 41 may also be adjusted according to installation conditions. The characteristic impedance may be calculated as a function of, for example, a line thickness, a substrate thickness and a dielectric constant of substrate, when the impedance transformer 40 is designed. When the impedance transformation circuit 41 is designed, for example, Binomial multisection matching transformers or Chebyshev multisection matching transformers may be used.

Figure 7A:
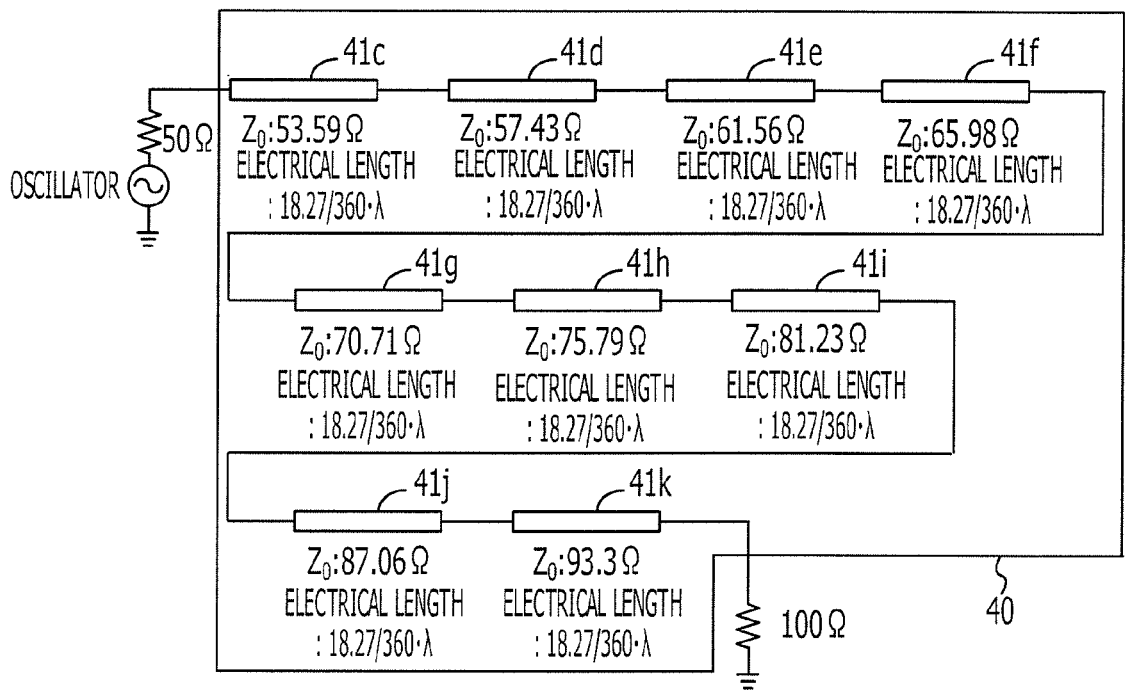
FIG. 7A illustrates an example of an impedance transformer.

FIG. 7A illustrates an example of an impedance transformer. In FIG. 7A, the impedance transformer 40 is illustrated for a case where the line length of the impedance transformation circuit 41 is not λ/4. In FIG. 7A, the transmission lines having the transmission line length of 18.27/360λ are used as the impedance transformation circuits 41 (41*c*-41*k*), and nine impedance transformation circuits 41 are coupled in series. Therefore, the entire line length of the impedance transformer 40 illustrated in FIG. 7A may be 164.47/360λ. The impedance Z of each impedance transformation circuit 41 is represented by the equation (3), when each impedance transformation circuit 41 illustrated in FIG. 6 and FIG. 7A sees an output terminal thereof from an input terminal thereof.

$$Z = Z_0 \frac{Z_r + j \cdot Z_0 \cdot \tan\left(2 \cdot \pi \cdot \frac{l}{\lambda_s}\right)}{Z_0 + j \cdot Z_r \cdot \tan\left(2 \cdot \pi \cdot \frac{l}{\lambda_s}\right)} \quad (3)$$

Z0 is the characteristic impedance of the line, Zr is a load of the output end, and λs is wavelength of the signal input to the impedance transformation circuit 41.

The characteristic of the impedance transformer 40 may be evaluated using reflection of signal (e.g., s11 characteristic) or the variation of the reactance based on the variation of the frequency of the input signal.

Figure 7B:
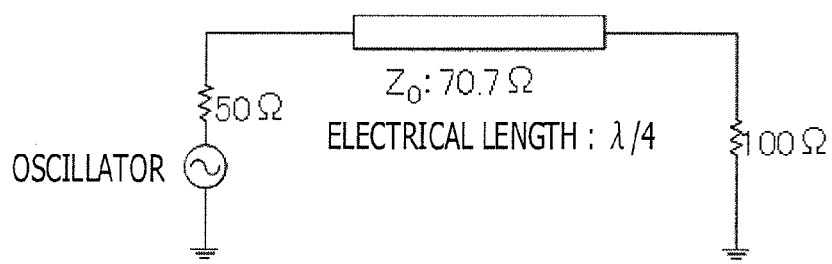
FIG. 7B illustrates an example of an impedance transformation circuit.
Figure 8:
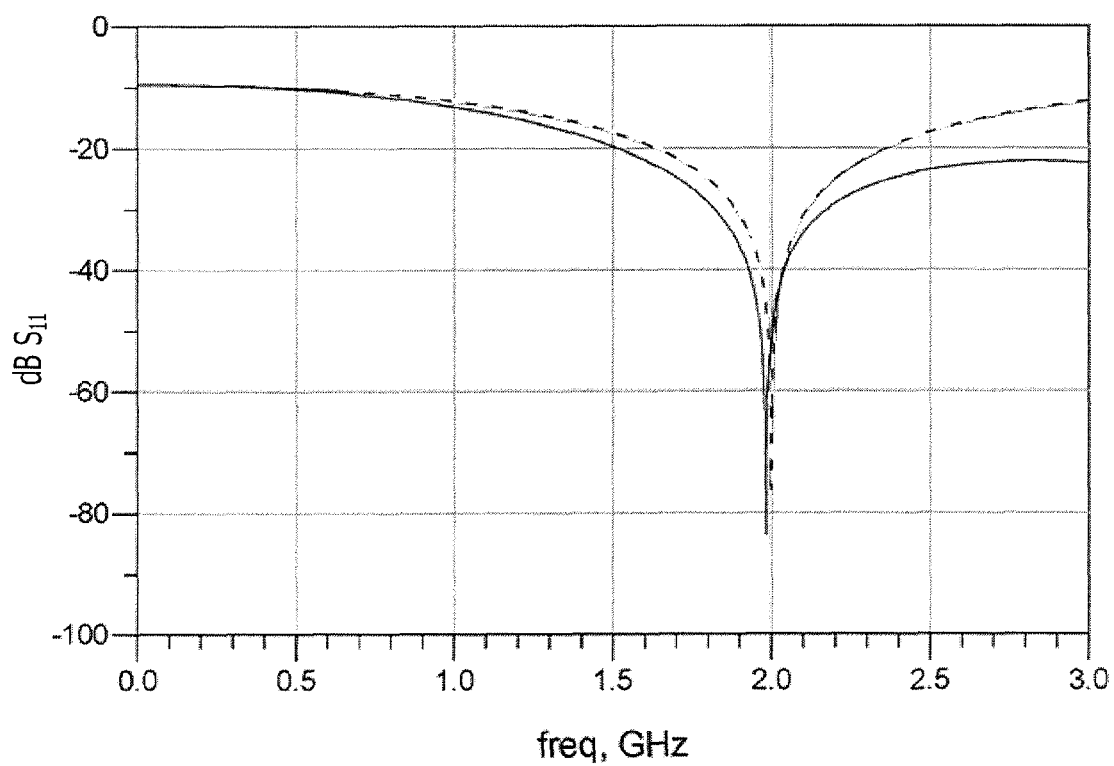
FIG. 8 illustrates an example of a relationship between an input reflection coefficient and a frequency of an input signal.

FIG. 8 illustrates an example of a relationship between an input reflection coefficient and a frequency of an input signal. The solid line illustrated in FIG. 8 represents the input reflection coefficient (s11) of the signal of the impedance transformer 40 illustrated in FIG. 7A as a function of the wavelength λs of the signal. The dashed-line illustrated in FIG. 8 represents the relationship between the input reflection coefficient and the frequency of the input signal in a case where a single impedance transformation circuit 41 is used as the impedance transformer. In the configuration of FIGS. 7A and 7B, the input signal may be generated by the oscillator. In a graph represented in FIG. 8, the value indicated by the solid line is smaller than that indicated by the dashed-line in a frequency range of from 1 GHz to 3 GHz. Therefore, when the impedance transformer 40 illustrated in FIG. 7A is used, the reflection coefficient in the impedance transformer may become smaller and the characteristic of the impedance transformer may be enhanced in the frequency range of 1 GHz to 3 GHz 1, as compared to a case where the impedance transformer 40 illustrated in FIG. 7B is used.

Figure 9:
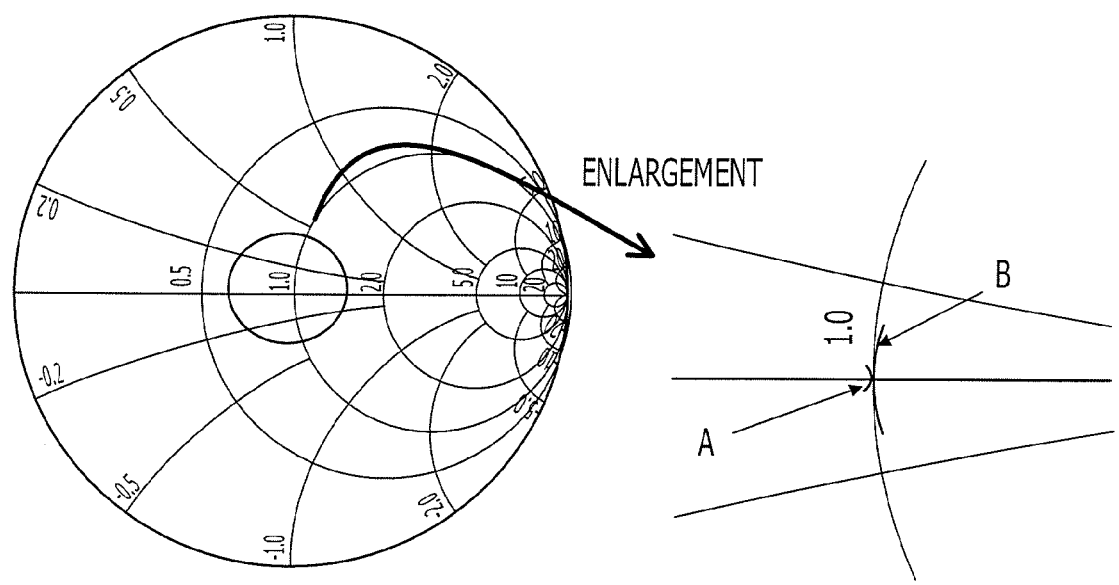
FIG. 9 illustrates an example of a reactance variation.

FIG. 9 illustrates an example of a variation of the reactance. FIG. 9 illustrates the variation of the reactance based on the variation of the frequency of the input signal. "A" in FIG. 9 represents the variation of the reactance component of the output signal in a case where the frequency of the input signal to the impedance transformer 40 illustrated in FIG. 6A varies from f1 to f5. "B" in FIG. 9 represents the variation of the reactance component of the output signal in a case where the frequency of the input signal to the impedance transformer illustrated in FIG. 7B is varied from f1 up to f5. The impedance transformer illustrated in FIG. 7B is formed by a single stage of the impedance transformation circuit 41. FIG. 9 may be represented such that the variation of the reactance component becomes smaller as the number of the impedance transformation circuits 41 increases.

The impedance transformer 40 may include, for example, a multi-stage of the impedance transformer including a plurality of the impedance transformation circuits 41, causing the variation of the reactance component based on the variation of the frequency of the input signal to the impedance transformer 40 to become smaller. When the impedance transformer 40 in which the variation of the reactance component is small is used, the parallel resonance circuit 30 in the matching circuit 20 may not be required to match the variation of the reactance component generated by the impedance transformer 40. Therefore, when the impedance transformer 40 in which the variation of the reactance component is smaller is used, the parallel resonance circuit 30 may not be required to perform a matching operation in accordance with the variation of the reactance generated by the impedance transformer 40. Therefore, an operating frequency band of the parallel resonance circuit 30 may be broadened.

Figure 10:
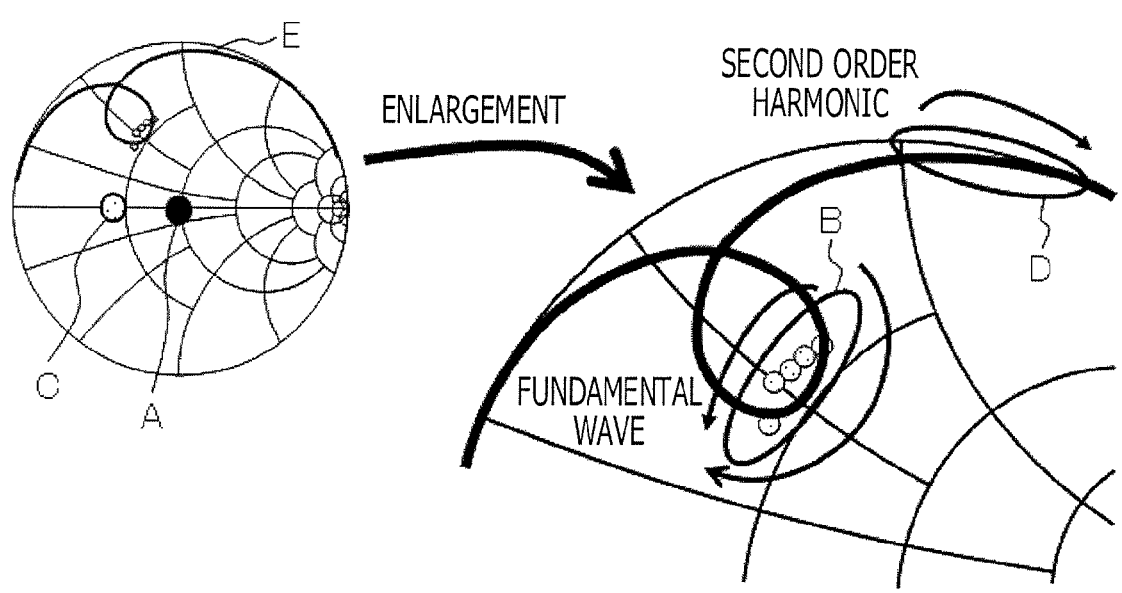
FIG. 10 illustrates an example of a frequency characteristic adjustment method.

FIG. 10 illustrates an example of a frequency characteristic adjustment method. A method of adjusting the frequency characteristic of the matching circuit 20 is illustrated in FIG. 10. The frequency characteristic of the matching circuit 20 is adjusted to a target matching value.

"A" on the Smith Chart of FIG. 10 represents the impedance of the output load 12. Impedance characteristics of the fundamental wave of the output from the amplification device 11 may correspond to a plurality of points of "B" as illustrated in FIG. 10B. The impedance of the output load 12 is adjusted to the value of the resistance component of the target matching impedance by the impedance transformer 40. When the impedance transformer 40 is coupled to the output load 12, the impedance becomes "C" as illustrated in FIG. 10. Further, the transmission line 21 is coupled to the impedance transformer 40 and thus, the reactance component is adjusted to the value around the target impedance "B".

The impedance characteristic of the second order harmonic output from the amplification device 11 becomes a circle moving in a clockwise direction along an outer periphery of the Smith chart as illustrated in FIG. 3B. Thus, the target matching value with respect to the second order harmonic is represented as "D" in FIG. 10. The impedance characteristic of the matching circuit 20 may be adjusted to at least one of a target impedance, which varies in clockwise direction, of the second order harmonic, and another target impedance, which varies in a counter-clockwise direction, of the fundamental wave using the parallel resonance circuit 30.

Figure 11:
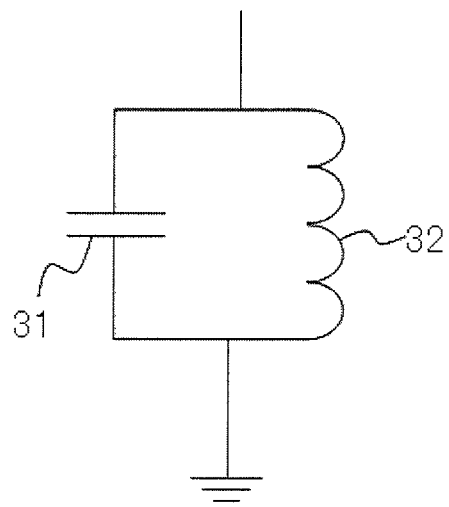
FIG. 11 illustrates an example of a parallel resonance circuit.

FIG. 11 illustrates an example of a parallel resonance circuit. The parallel resonance circuit 30 illustrated in FIG. 11 includes, for example, a capacitor 31 and an inductor 32. When the capacitance of the capacitor 31 is defined as C and the inductance of the inductor 32 is defined as L, the resonance frequency f of the parallel resonance circuit 30 is represented by the following equation (4).

$$f = \frac{1}{2 \cdot \pi \cdot \sqrt{L \cdot C}} \quad (4)$$

Half-width (bandwidth) of the resonance curve of the parallel resonance circuit 30 is represented by the equation (5) in proportional to the conductance of a resistor coupled to the resonance circuit in parallel.

$$\Delta f \propto \frac{1}{2 \cdot \pi \cdot C} \quad (5)$$

The bandwidth of the parallel resonance circuit 30 becomes wider as the variation of the reactance component due to (by) the frequency of the signal input to the parallel resonance circuit 30 becomes smaller. In the amplifier 10 illustrated in FIG. 2A, the variation of the reactance component in the impedance transformer 40 due to the input frequency is small and thus, the parallel resonance circuit 30 may not be required to match the variation amount of the reaction due to the impedance transformer 40. Therefore, the bandwidth of the parallel resonance circuit 30 may become larger as compared to a case where the variation amount due to the impedance transformer 40 is included to be matched. In the amplifier 10 illustrated in FIG. 2A, an effect due to the device deviation of each device included in the parallel resonance circuit 30 may be reduced.

In the equation (5), the bandwidth is proportional to the reciprocal of the capacitance of the capacitor 31 included in the parallel resonance circuit 30. Therefore, the bandwidth of the parallel resonance circuit 30 may become wider as the capacitance of the capacitor 31 becomes smaller. When the bandwidth of the parallel resonance circuit 30 becomes wider, the variation of the reactance component based on the device deviation becomes smaller and thus, the amplifier may become robust against the device deviation.

The parallel resonance circuit 30 may include an open stub 33 and a short stub 34. When the parallel resonance circuit 30 includes the open stub 33 and the short stub 34, the parallel resonance circuit 30 is designed using the transmission line and thus, the parallel resonance circuit 30 may be used even when the frequency of the signal is high.

Figure 12:
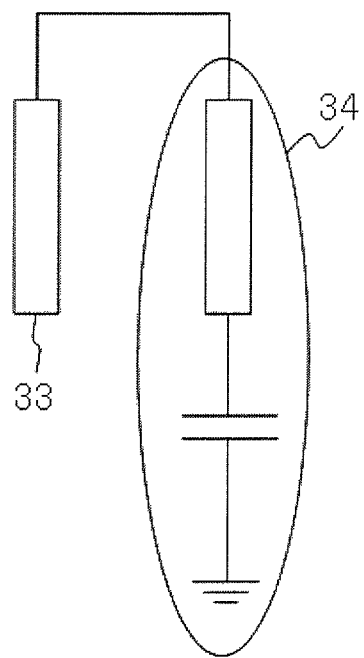
FIG. 12 illustrates an example of a parallel resonance circuit.

FIG. 12 illustrates an example of a parallel resonance circuit. Assuming that the wavelength of electronic wave of the resonance frequency of the parallel resonance circuit 30 is λ, the impedance of the open stub 33 is represented by the following equation (6).

$$Z = Z_{0op} \cdot \frac{1}{j \cdot \tan\left(2 \cdot \pi \cdot \frac{l_{op}}{\lambda}\right)} \quad (6)$$

where, the characteristic impedance and the line length of the open stub 33 are $Z_{0op}$ and $l_{op}$, respectively.

Assuming that the characteristic impedance and the line length of the short stub 34 are $Z_{0sh}$ and $l_{sh}$, respectively, the impedance of the short stub 34 is represented by the following equation (7).

$$Z = Z_{0sh} \cdot j \cdot \tan\left(2 \cdot \pi \cdot \frac{l_{sh}}{\lambda}\right) \quad (7)$$

The line length $l_{op}$ of the open stub 33 and the line length $l_{sh}$ of the short stub 34 need to satisfy a relationship represented by the following equation (8) in order for the parallel resonance circuit 30 to resonate at the wavelength λ.

$$\frac{Z_{0sh}}{Z_{0op}} \cdot \tan\left(2 \cdot \pi \cdot \frac{l_{op}}{\lambda}\right) \cdot \tan\left(2 \cdot \pi \cdot \frac{l_{sh}}{\lambda}\right) = 1 \quad (8)$$

When the open stub 33 is coupled with the short stub 34 in parallel, the impedance Z is represented by the following equation (9).

$$Z = \frac{1}{\frac{1}{Z_{0op}} j \cdot \tan\left(2 \cdot \pi \cdot \frac{l_{op}}{\lambda}\right) + \frac{1}{Z_{0sh} \cdot j \cdot \tan\left(2 \cdot \pi \cdot \frac{l_{sh}}{\lambda}\right)}} \quad (9)$$

The open stub 33 serves as a condenser of an LC resonance circuit and thus, the value in the equation (9) corresponding to $j\omega_0 C$ is represented by the equation (10).

Here, $\omega_0$ is a resonance frequency.

$$\frac{1}{Z_{0op}} j \cdot \tan\left(2 \cdot \pi \cdot \frac{l_{op}}{\lambda_0}\right) \quad (10)$$

As for the LC resonance circuit, the half-width (bandwidth) of the resonance curve is represented by the following equation (11).

$$\Delta f = \frac{G}{2 \cdot \pi \cdot C} \quad (11)$$

Here, G is conductance. Accordingly, the half-width (bandwidth) of the resonance curve of the parallel resonance circuit 30 from the equation (10) and the equation (11) may approximately proportional to the value of the following equation (12).

$$Z_{0op} \cdot \frac{1}{\tan\left(2\cdot\pi\cdot\frac{l_{op}}{\lambda}\right)} \quad (12)$$

The half-width (bandwidth) of the resonance curve of the parallel resonance circuit 30 from the equation (8) and the equation (12) may be approximately proportional to the value of the following equation (13).

$$Z_{0sh} \cdot \tan\left(2\cdot\pi\cdot\frac{l_{sh}}{\lambda}\right) \quad (13)$$

Figures 13A, 13B:
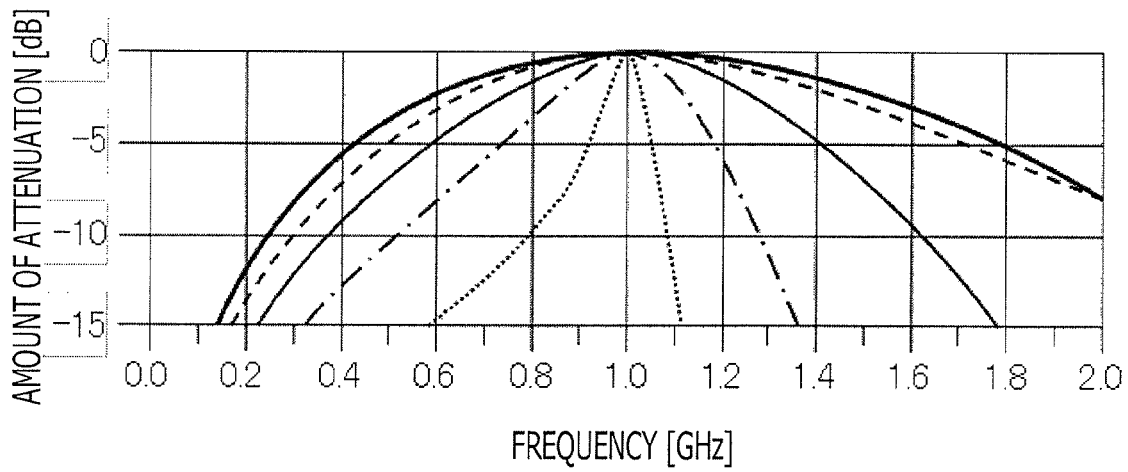
FIG. 13A and FIG. 13B illustrate an example of a relationship between frequency of an input signal and an amount of attenuation of the input signal.

FIG. 13A and FIG. 13B illustrate an example of a relationship between a frequency and an amount of attenuation of an input signal. FIG. 13A illustrates a relationship between the frequency of the input signal and the signal attenuation when the values represented by the equation (12) and the equation (13) are varied with respect to the parallel resonance circuit 30. The table of FIG. 13B lists values represented by the equation (12) or the equation (13) with respect to each curve indicated in the graph of FIG. 13A. When referring to FIG. 13A and FIG. 13B, the variation of the attenuation amount of the signal at the time when the frequency of the input signal is varied becomes smaller as the values represented by the equation (12) or the equation (13) become larger. The fact that the variation of the attenuation amount of the signal according to the variation of the frequency of the signal is small indicates that the frequency band over which the parallel resonance circuit 30 is used is wide. Therefore, the frequency band over which the parallel resonance circuit 30 may use becomes wide as the value of the parallel resonance circuit 30 indicated by the equation (12) or the equation (13) becomes larger. When the frequency band over which the parallel resonance circuit 30 may be used is wide, the deviation effect of the devices included in the parallel resonance circuit 30 may be reduced.

As illustrated in FIG. 10, when matching is made with respect to the second order harmonic input from the amplification device 11, the target value may be on the outer periphery of the Smith chart. Therefore, when the parallel resonance circuit 30 is designed such that the signal of the second order harmonic at the frequency band of the signal intended to be amplified is short-circuited at the stub, the characteristic may be improved. The resonance frequency of the parallel resonance circuit 30 may be substantially the center of the frequency band of the signal intended to be amplified. The signal of the frequency lower than the resonance frequency is short-circuited and thus, when the length of the open stub 33 is set to one-eighth or less of the wavelength of the fundamental wave, the efficiency may be improved. Therefore, the length of the open stub 33 becomes one-fourth or less of the wavelength with respect to the second order harmonic.

The short stub 34 is required to have characteristic similar to an inductance and thus, when the line length is set to one-fourth or less of the wavelength of the fundamental wave, the characteristic may be improved. The impedance of the short stub 34 is represented by the equation (7) and thus, the line length of the short stub 34 may be set equal to or greater than $2n\lambda/4$ and equal to or less than $(2n+1)\lambda/4$, where n is a positive integer.

The amplification device 11, the transmission line 21 and the impedance transformer 40 included in the amplifier 10 illustrated in FIG. 12 may be substantially the same or similar to elements of the amplifier 10 illustrated in FIG. 2B. The variation of the reactance component based on the impedance transformer 40 may become small also in the amplifier 10 illustrated in FIG. 12. Therefore, the parallel resonance circuit 30 may be designed without considering the effect of variation of the reactance component by the impedance transformer 40. The bandwidth over which the parallel resonance circuit 30 operates may become wider as compared to the resonance circuit used in a circuit including an impedance transformer in which the variation of the reactance component based on the frequency of the signal is large. The deviation effect of the device included in the parallel resonance circuit 30 may be reduced in the amplifier 10.

Figure 14:
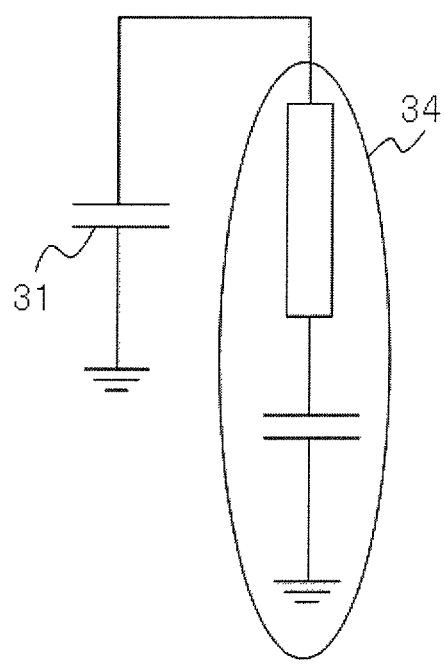
FIG. 14 illustrates an example of parallel resonance circuit.

FIG. 14 illustrates an example of a parallel resonance circuit. The parallel resonance circuit 30 illustrated in FIG. 14 includes, for example, the capacitor 31 and the short stub 34. The amplification device 11, the transmission line 21 and the impedance transformer 40 included in the amplifier 10 illustrated in FIG. 14 may be substantially the same or similar to the elements of the amplifier 10 illustrated in FIG. 2B or FIG. 12.

Assuming that the wavelength of electronic wave at the resonance frequency of the parallel resonance circuit 30 is λ, the capacitance of the capacitor 31 is C, the characteristic impedance of the transmission line of the stub part of the short stub 34 is Z0, and the transmission line length is $I_{sh}$, the resonance frequency f of the parallel resonance circuit 30 illustrated in FIG. 14 is represented by the following equation (14).

$$f = \frac{1}{2\cdot\pi\cdot C\cdot Z_0 \cdot \tan\left(2\cdot\pi\cdot\frac{l_{sh}}{\lambda}\right)} \quad (14)$$

The bandwidth of the parallel resonance circuit 30 becomes wider by making the value of $1/(2\pi C)$ large. For example, the capacitance C of the capacitor 31 becomes small to make the value of $1/(2\pi C)$ large.

Figure 15:
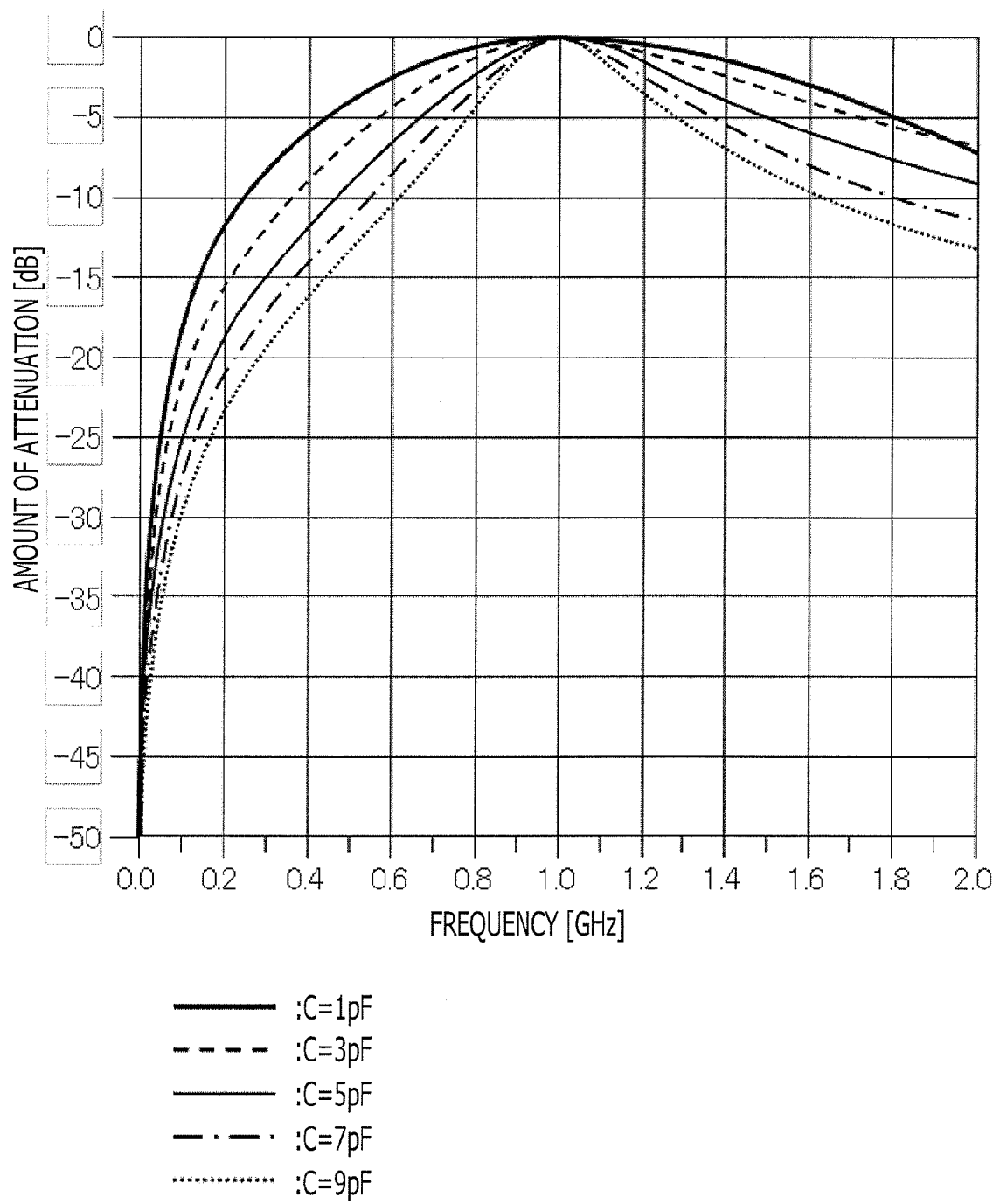
FIG. 15 illustrates an example of a relationship between frequency of an input signal and an amount of attenuation of the input signal.

FIG. 15 is a view illustrating an example of a relationship between the frequency and an attenuation amount of the input signal. FIG. 15 illustrates the relationship between the frequency and the attenuation of the input signal when the capacitance of the capacitor 31 is made to vary with respect to the parallel resonance circuit 30. FIG. 15 illustrates that the attenuation amount of the input signal becomes smaller as the capacitance of the capacitor 31 becomes smaller. The variation of the attenuation amount of signal becomes smaller at the time when the frequency of the input signal is varied as the capacitance of the capacitor 31 becomes smaller. Small attenuation amount of the signal over broadband or small variation of the attenuation amount of the signal according to variation of the frequency of the signal may indicate that the frequency band over which the parallel resonance circuit 30 may be used is wide. Therefore, the useable frequency band becomes wider as the capacitance of the capacitor 31 becomes smaller in the parallel resonance circuit 30 as illustrated in FIG. 14. When the frequency band over which the parallel resonance circuit 30 may be used is wide, the deviation effect of the devices included in the parallel resonance circuit 30 may be reduced.

The impedance of the short stub 34 included in the parallel resonance circuit 30 illustrated in FIG. 14 is represented by the equation (7). The short stub 34 is required to have characteristic similar to an inductance and thus, when the line length is set to one-fourth or less of the wavelength of the fundamental wave, the characteristic may be improved. The transmission line length of the short stub 34 may be set equal to or greater than 2 nλ/4 and equal to or less than (2n+1)λ/4, where n is a positive integer.

The characteristic impedance of the transmission line 21 may be set, for example, to larger than that of the output load 12. The transmission line 21 may be used for adjusting the reactance component of the impedance. A rotation angle of the reactance component of the impedance of the transmission line 21 on the Smith chart becomes smaller as the characteristic impedance of the transmission line 21 becomes larger. Therefore, when the adjustment amount of the reactance is an equal amount, the length of the transmission line 21 may be set to a smaller length as the characteristic impedance of the transmission line 21 becomes higher.

Figure 16:
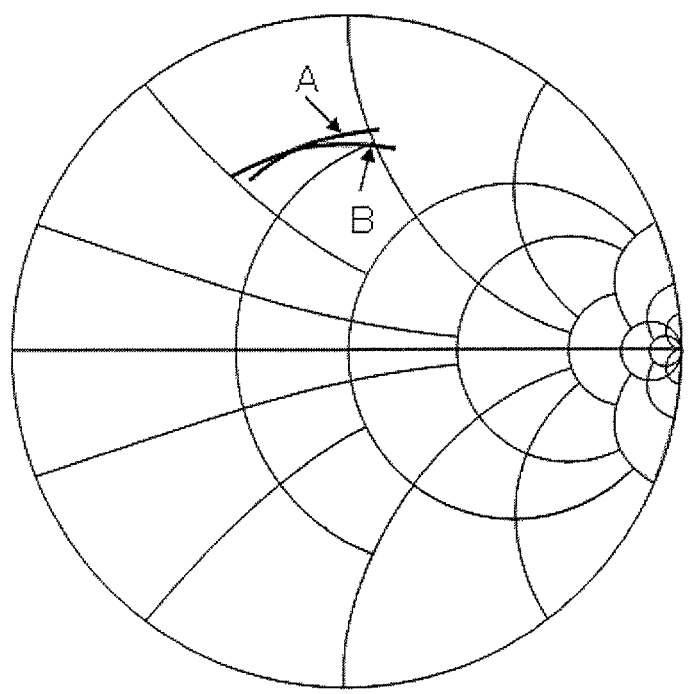
FIG. 16 illustrates an example of an impedance variation.

FIG. 16 illustrates an example of impedance variation. The impedance variation in the transmission line 21 is illustrated in FIG. 16. "A" of FIG. 16 illustrates an example of the impedance variation in the transmission line 21 having the characteristic impedance higher than the characteristic impedance of the output load 12. "B" of FIG. 16 illustrates an example of the impedance variation in the transmission line 21 having the characteristic impedance which is equal to the characteristic impedance of the output load 12. The varying amount of the frequency of the input signal may be substantially the same at any of the curve "A" and "B". It may be seen from FIG. 16 that the length of the curve "A" is smaller than that of the curve "B". Therefore, the characteristic impedance of the transmission line 21 is made larger than that of the output load 12, such that the line length may become smaller.

Figure 17A:
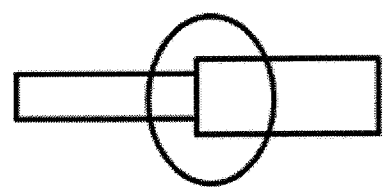
FIGS. 17A & 17B illustrate examples of impedance transformers.
Figure 17B:
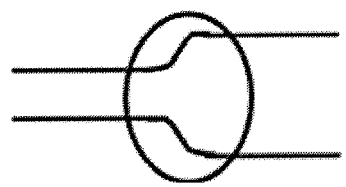

FIG. 17 illustrates an example of an impedance transformer. FIG. 2A illustrates the impedance transformer 40 in which the transmission lines having different line width are coupled to each other and the transmission line width varies step-wise over the length as illustrated in FIG. 17A. The line width may vary continuously as illustrated in FIG. 17B. The line length of the impedance transformer 40 varies according to the variation angle of the line width and thus, the freedom of design may be increased. The impedance transformer 40 having the line width varying continuously as illustrated in FIG. 17B may correspond to a single impedance transformation circuit 41 having the line width varying continuously. The impedance transformer 40 having the line width varying continuously may correspond to a single impedance transformer formed by coupling numerous step-shaped impedance transformers 41. Therefore, when the impedance transformer 40 having the line width varying continuously is used, the variation of the reactance due to the variation of the frequency of the signal may be reduced, similar to the impedance transformer 40 including a plurality of step-shaped impedance transformation circuits 41. The impedance transformer 40 illustrated in FIG. 17B may have the line length longer than one-fourth of the wavelength of the electronic wave having the frequency which is substantially equal to the resonance frequency of the parallel resonance circuit 30. The impedance transformer 40 illustrated in FIG. 17B may be used in the parallel resonance circuit of FIG. 2B, FIG. 12 and FIG. 14.

When the open stub 33 or the short stub 34 is used, the line length may be adjusted by varying the characteristic impedance of the open stub 33 or the short stub 34. For example, the impedance of the open stub 33 is represented by the following equation (15). Therefore, when the characteristic impedance $Z_{Oop}$ of the open stub 33 is made small, the value of the equation (16) may become small in a case where the line length is adjusted using the same impedance.

$$Z = Z_{Oop} \cdot \frac{1}{j \cdot \tan\left(2 \cdot \pi \cdot \frac{l_{op}}{\lambda}\right)} \tag{15}$$

$$\tan\left(2 \cdot \pi \cdot \frac{l_{op}}{\lambda}\right) \tag{16}$$

When the characteristic impedance $Z_{Oop}$ of the open stub 33 is made small while keeping the impedance of the open stub 33 constant, the line length lop of the open stub 33 may become shorter. The impedance with respect to the short stub 34 is represented by the following equation (17).

$$Z = Z_{Osh} \cdot j \cdot \tan\left(2 \cdot \pi \cdot \frac{l_{sh}}{\lambda}\right) \tag{17}$$

When the characteristic impedance $Z_{Osh}$ of the short stub 34 is made small, the value of the following equation (18) may become large in a case where the line length is adjusted using the same impedance.

$$\tan\left(2 \cdot \pi \cdot \frac{l_{sh}}{\lambda}\right) \tag{18}$$

When the characteristic impedance $Z_{Osh}$ of the open stub 34 is made large while keeping the impedance of the short stub 34 constant, the line length $I_{sh}$ of the short stub 34 may become shorter.

Figure 18:
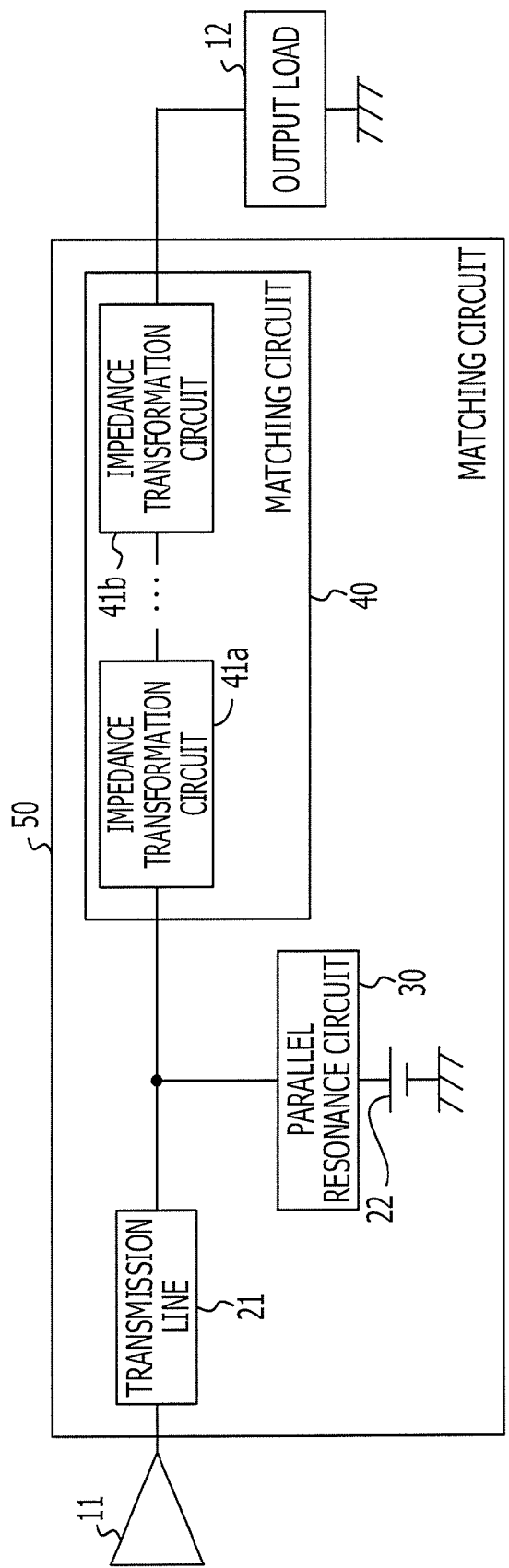
FIG. 18 illustrates an example of an amplifier.

FIG. 18 illustrates an example of an amplifier. The amplifier 10 illustrated in FIG. 18 includes, for example, the amplification device 11 and a matching circuit 50. The matching circuit 50 includes, for example, the transmission line 21, the parallel resonance circuit 30, the impedance transformer 40 and a bias circuit 22. The bias circuit 22 may be any circuit which supplies a bias power to the amplification device 11. The amplifier illustrated in FIG. 18 may be used together with the configurations illustrated in FIGS. 1 through 18.

The transmission line may be coupled to the impedance transformer 40 in series or in parallel.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An amplifier comprising:
an amplifying device configured to amplify an input signal; and
a matching circuit coupled to the amplifying device, the matching circuit being configured to include:

a connecting portion coupled to the amplifying device, an impedance transformer coupled to the connecting portion at an opposing side of the amplifying device, and a parallel resonance circuit coupled to a portion of the connecting portion between the impedance transformer and the amplifying device, wherein a circuit length of the impedance transformer is longer than one-fourth of a wavelength of an electronic wave having a frequency which is substantially equal to a resonance frequency of the parallel resonance circuit.

2. The amplifier according to claim 1, wherein the impedance transformer is configured to include a plurality of impedance transformation circuits, and a total circuit length of the plurality of the impedance transformation circuits is longer than one-fourth of the wavelength.

3. The amplifier according to claim 1, wherein the parallel resonance circuit is configured to include an open stub and a short stub coupled to the open stub.

4. The amplifier according to claim 3, wherein the length of the open stub is equal to or less than one-eighth of the wavelength.

5. The amplifier according to claim 3, wherein the length of the short stub is equal to or less than one-fourth of the wavelength.

6. The amplifier according to claim 1, wherein the parallel resonance circuit comprises a capacitor and an inductor coupled to the capacitor in parallel.

7. The amplifier according to claim 1, wherein one end of the parallel resonance circuit is coupled to a bias circuit.

8. An amplifying method comprising:

amplifying an input signal by an amplifying device coupled to a connecting portion; and matching an impedance of an output load, the output load being coupled to a matching circuit, to a target impedance by an impedance transformer in the matching circuit, which is coupled to the connecting portion at an opposing side of the amplifying device and is configured to receive an amplified input signal via the connecting portion, a parallel resonance circuit being coupled to a portion of the connecting portion between the impedance transformer and the amplifying device, wherein a circuit length of the impedance transformer is longer than one-fourth of a wavelength of an electronic wave having a frequency which is substantially equal to a resonance frequency of the parallel resonance circuit.

9. An amplifier comprising:

an amplifying device configured to amplify an input signal; and a matching circuit coupled to the amplifying device, the matching circuit being configured to include an impedance transformer and a parallel resonance circuit coupled to a connecting portion which spans from the impedance transformer to the amplifying device, wherein:

a circuit length of the impedance transformer is longer than one-fourth of a wavelength of an electronic wave having a frequency which is substantially equal to a resonance frequency of the parallel resonance circuit, the parallel resonance circuit is configured to include an open stub and a short stub coupled to the open stub, and the length of the open stub is equal to or less than one-eighth of the wavelength.

* * * * *